(12) United States Patent
Farooq et al.

(10) Patent No.: US 8,114,707 B2
(45) Date of Patent: Feb. 14, 2012

(54) METHOD OF FORMING A MULTI-CHIP STACKED STRUCTURE INCLUDING A THIN INTERPOSER CHIP HAVING A FACE-TO-BACK BONDING WITH ANOTHER CHIP

(75) Inventors: Mukta G. Farooq, Hopewell Junction, NY (US); Kevin S. Petrarca, Newburgh, NY (US); Richard P. Volant, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 133 days.

(21) Appl. No.: 12/731,487

(22) Filed: Mar. 25, 2010

(65) Prior Publication Data

US 2011/0237026 A1 Sep. 29, 2011

(51) Int. Cl.
 *H01L 21/48* (2006.01)
(52) U.S. Cl. ........ 438/107; 438/108; 438/113; 438/458; 438/459; 438/464; 257/E21.499
(58) Field of Classification Search .................. 438/108, 438/107, 113, 458, 459, 464; 257/E21.499
See application file for complete search history.

(56) References Cited

U.S. PATENT DOCUMENTS

| | | | |
|---|---|---|---|
| 4,479,088 A | 10/1984 | Stopper | |
| 5,426,072 A * | 6/1995 | Finnila | 438/107 |
| 5,915,167 A | 6/1999 | Leedy | |
| 6,133,640 A | 10/2000 | Leedy | |
| 6,208,545 B1 | 3/2001 | Leedy | |
| 6,448,634 B1 | 9/2002 | Hashimoto | |
| 6,531,338 B2 * | 3/2003 | Akram et al. | 438/108 |
| 6,551,857 B2 | 4/2003 | Leedy | |
| 6,563,224 B2 | 5/2003 | Leedy | |
| 6,632,706 B1 | 10/2003 | Leedy | |
| 7,138,295 B2 | 11/2006 | Leedy | |
| 7,189,595 B2 * | 3/2007 | Magerlein et al. | 438/108 |
| 7,193,239 B2 | 3/2007 | Leedy | |
| 7,247,518 B2 * | 7/2007 | Shibata | 438/108 |
| 7,474,004 B2 | 1/2009 | Leedy | |
| 7,504,732 B2 | 3/2009 | Leedy | |
| 7,564,118 B2 * | 7/2009 | Pogge et al. | 257/621 |

(Continued)

FOREIGN PATENT DOCUMENTS

| | | |
|---|---|---|
| CN | 1155050 | 6/2004 |
| CN | 1525485 | 9/2004 |
| CN | 101188235 | 10/2010 |
| EP | 0975472 | 2/2000 |
| EP | 1986233 | 10/2008 |
| JP | 2002516033 | 5/2002 |
| JP | 2008028407 | 2/2008 |
| JP | 2008166831 | 7/2008 |
| JP | 2008166832 | 7/2008 |
| JP | 2008172254 | 7/2008 |
| KR | 10-0639752 | 10/2006 |
| KR | 10-0785821 | 12/2007 |
| TW | 412854 | 11/2000 |

*Primary Examiner* — Michael Trinh
(74) *Attorney, Agent, or Firm* — Scully, Scott, Murphy & Presser, P.C.; Wenjie Li

(57) ABSTRACT

A temporary substrate having an array of first solder pads is bonded to the front side of a first substrate by reflowing an array of first solder balls. The first substrate is thinned by removing the back side, and an array of second solder pads is formed on the back side surface of the first substrate. The assembly of the first substrate and the temporary substrate is diced to form a plurality of stacks, each including an assembly of a first semiconductor chip and a handle portion. A second semiconductor chip is bonded to an assembly through an array of the second solder balls. The handle portion is removed from each assembly by reflowing the array of the first solder balls, while the array of the second solder balls does not reflow. The assembly is subsequently mounted on a packaging substrate employing the array of the first solder balls.

20 Claims, 7 Drawing Sheets

U.S. PATENT DOCUMENTS

| | | |
|---|---|---|
| 7,705,466 B2 | 4/2010 | Leedy |
| 2002/0132465 A1 | 9/2002 | Leedy |
| 2003/0173608 A1 | 9/2003 | Leedy |
| 2007/0048896 A1* | 3/2007 | Andry et al. ............ 438/106 |
| 2009/0067210 A1 | 3/2009 | Leedy |
| 2009/0174082 A1 | 7/2009 | Leedy |
| 2009/0175104 A1 | 7/2009 | Leedy |
| 2009/0218700 A1 | 9/2009 | Leedy |
| 2009/0219742 A1 | 9/2009 | Leedy |
| 2009/0219743 A1 | 9/2009 | Leedy |
| 2009/0219744 A1 | 9/2009 | Leedy |
| 2009/0219772 A1 | 9/2009 | Leedy |
| 2009/0230501 A1 | 9/2009 | Leedy |
| 2010/0171224 A1 | 7/2010 | Leedy |
| 2010/0171225 A1 | 7/2010 | Leedy |
| 2010/0172197 A1 | 7/2010 | Leedy |
| 2010/0173453 A1 | 7/2010 | Leedy |

* cited by examiner

METHOD OF FORMING A MULTI-CHIP STACKED STRUCTURE INCLUDING A THIN INTERPOSER CHIP HAVING A FACE-TO-BACK BONDING WITH ANOTHER CHIP

BACKGROUND

The present invention generally relates to a method of fabricating a semiconductor structures, and particularly to a method of forming a multi-chip stacked semiconductor structure including a thin interposer chip having a face-to-back bonding with another chip.

Recent development in three-dimensional (3D) chip stacking technology employs thin semiconductor chips to enable vertical stacking of multiple semiconductor chips. One of the difficulties in the 3D chip stacking technology stems from the thickness of semiconductor substrates employed in manufacturing a semiconductor chip. A typical semiconductor substrate as manufactured in a normal semiconductor processing sequence has a thickness from about 500 µm to about 1,000 µm. Formation of through-wafer vias (TWVs) that extend through the entirety of the thickness of the semiconductor substrate requires extraordinary processing sequences and high processing cost.

An alternative is to thin a semiconductor substrate after the formation of semiconductor devices and interconnects on a semiconductor substrate is completed and prior to dicing the semiconductor into semiconductor chips, or "dies." By thinning the semiconductor substrate to a thickness less than 300 µm, through-wafer vias (TWVs) having a less height than the full thickness of the semiconductor substrate employed during a semiconductor manufacturing sequence may be employed to enable electrical connection between multiple semiconductor chips. In addition, thinned semiconductor substrate provides additional advantages such as improved thermal dissipation and improved device coupling across semiconductor devices located in different semiconductor chips that are vertically stacked.

The thinning of semiconductor chips is limited by the capability for handling the thinned semiconductor chips. This is because extremely thin semiconductor substrates or semiconductor chips having a thickness less than 200 microns are prone to breakage. Semiconductor chips having a thickness less than 100 microns are too fragile to handle with normal mechanical handling equipment without suffering from significant yield loss due to breakage.

Nonetheless, thin semiconductor chips having a thickness less than 100 microns offer a significant advantage to performance by reducing both the resistance and the capacitance of through-substrate vias (TSVs). Further, the reduction in the length of TSVs in a semiconductor chip enhances electromigration resistance of the TSVs because the shorter TSVs are less prone to electromigration. Thus, despite the difficulty in handling, thinned semiconductor chips are advantageous for high performance in multi-chip stacked semiconductor structures.

BRIEF SUMMARY

In an embodiment of the present invention, a method is provided for attaching a stack of a thin semiconductor chip, herein referred to as a interposer chip, and another semiconductor chip on a packaging substrate without significant yield loss during handing of the thin semiconductor chip such that the back side of the interposer chip is bonded to a front side of the other semiconductor chip.

A first substrate includes a first metal interconnect structure and a semiconductor substrate, in which an array of conductive studs is embedded. A first array of solder pads and an array of first solder balls having a low reflow temperature are formed on a front surface of the first metal interconnect structure. A temporary substrate having an array of solder pads is bonded to the first substrate by reflowing the array of the first solder balls. The first substrate is thinned by removing the back side of the semiconductor substrate, exposing the array of conductive studs, which become an array of through-substrate vias (TSVs). A second array of second solder pads is formed on the back side surface of the semiconductor substrate after thinning. Employing the temporary substrate to provide mechanical support, the assembly of the first substrate and the temporary substrate is diced to form a plurality of stacked temporary structures, each including an assembly of a first semiconductor chip and a handle portion. An array of second solder balls is formed on the second array of the second solder pads, and a second semiconductor chip is bonded to a stacked temporary structure through the array of the second solder balls such that the front side of second semiconductor chip faces the back side of the first semiconductor chip. The array of the second solder balls has a higher reflow temperature than the array of the first solder balls. The handle portion is removed from each assembly by reflowing the array of the first solder balls at an elevated temperature, while the array of the second solder balls does not reflow at that temperature. The assembly is subsequently mounted on a packaging substrate employing the array of the first solder balls.

According to an embodiment of the present invention, a method of forming a multi-chip assembly of semiconductor chips is provided. The method includes forming a stacked substrate assembly by bonding a semiconductor substrate to a temporary substrate through an array of first solder balls that bonds to an array of first solder pads on the semiconductor substrate; dicing the stacked substrate assembly to form a plurality of stacked temporary structures, each of the plurality of stacked temporary structures including a first semiconductor chip that is a portion of the semiconductor substrate and a handle portion that is a portion of the temporary substrate; bonding a second semiconductor chip to a stacked temporary structure among the plurality of stacked temporary structures, wherein an array of second solder balls is bonded to an array of second solder pads located on a first semiconductor chip in the stacked temporary structure and an array of third solder pads located on the second semiconductor chip; detaching a handle portion from the stacked temporary structure to form a stacked semiconductor chip structure; and forming a multi-chip assembly of semiconductor chips by bonding at least one stacked semiconductor chip structure including the stacked semiconductor chip structure to a packaging substrate.

DETAILED DESCRIPTION

Figure 1:
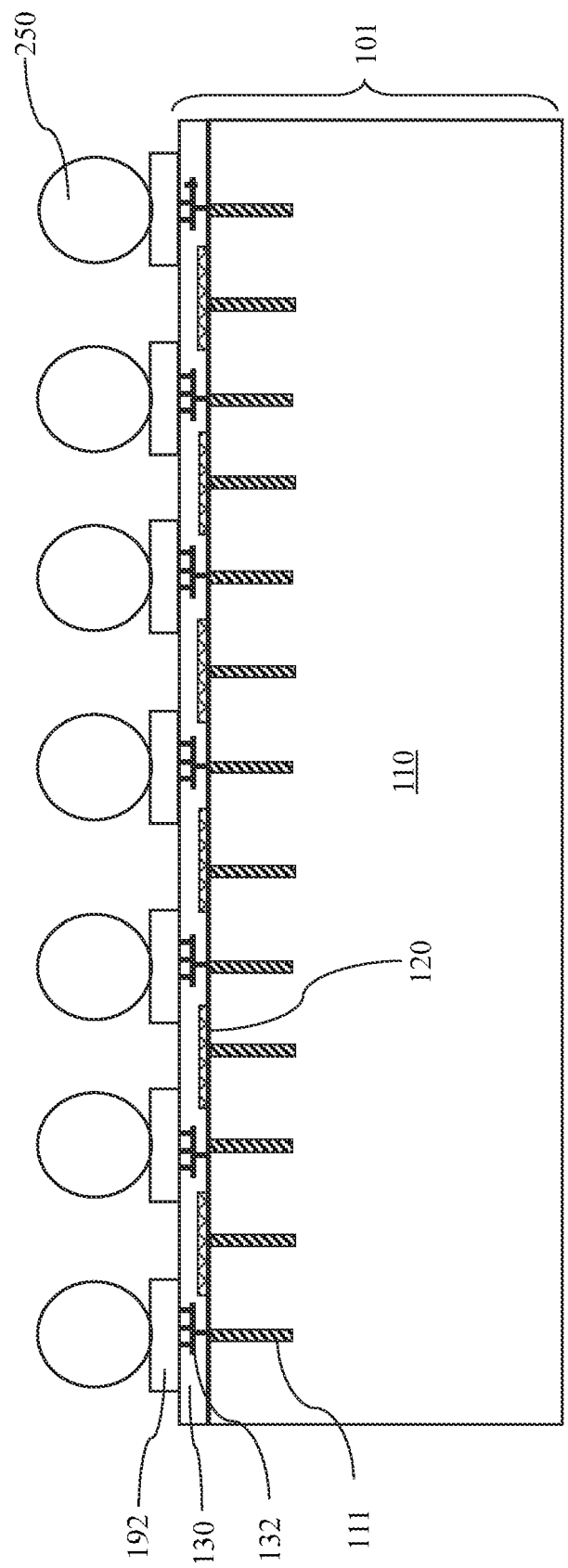
FIG. 1 is a vertical cross-sectional view of a first exemplary structure after formation of a first array of first solder pads and an array of first solder balls according to a first embodiment of the present invention.

As stated above, the present invention relates to a method of fabricating a semiconductor structures, and particularly to a method of forming a multi-chip stacked semiconductor structure including a thin interposer chip having a face-to-back bonding with another chip, which are now described in detail with accompanying figures. As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

Referring to FIG. 1, a first exemplary structure according to a first embodiment of the present invention includes a semiconductor substrate 101, which includes a stack, from bottom to top, of a first semiconductor layer 110 and a first metal interconnect structure layer. The first semiconductor layer 110 includes a semiconductor material at least in an upper portion that contact the first metal interconnect structure layer. Non-limiting examples of the semiconductor material include silicon, germanium, a silicon-germanium alloy, a silicon carbon alloy, a silicon-germanium-carbon alloy, gallium arsenide, indium arsenide, indium phosphide, III-V compound semiconductor materials, II-VI compound semiconductor materials, organic semiconductor materials, and other compound semiconductor materials. Preferably, at least the upper portion of the first semiconductor layer 110 is single crystalline, i.e., atoms are epitaxially aligned in a single crystalline lattice within the upper portion of the first semiconductor layer 110. The first semiconductor layer 110 can be a bulk semiconductor substrate, a semiconductor-on-insulator (SOI) substrate, or a hybrid substrate. For example, the first semiconductor layer 110 can be a single crystal silicon bulk substrate or a single crystal silicon SOI substrate. Preferably, the first semiconductor layer 110 as provided is sufficiently thick to enable mechanical handling without adverse impact on yield, i.e., to prevent breakage during mechanical handling. In one embodiment, the first semiconductor layer 110 has an initial thickness from 500 microns to 1,000 microns, although lesser and greater thicknesses are also contemplated herein. The upper portion of the first semiconductor layer 110 may have a built-in stress.

At least one first semiconductor device 120 is formed on and/or in the first semiconductor layer 110. The at least one first semiconductor device 120 can include a field effect transistor, a bipolar transistor, a memory cell such as a static random access memory (SRAM) cell or an embedded dynamic random access memory (eDRAM) cell, a capacitor, a resistor, an inductor, a varactor, an electrical fuse, an electro-optical semiconductor device, and/or any other type of semiconductor device. In one embodiment, the at least one first semiconductor device 120 form a plurality of processor chips.

An array of conductive studs 111 is formed within the first semiconductor layer 110, for example, by etching an array of trenches on a front side, i.e., the side on which the at least one first semiconductor device 120 is formed, of the first semiconductor layer 110. The depth of the trenches can be less than the thickness of the first semiconductor layer 110, or can be the same as the thickness of the first semiconductor layer 110. Preferably, the depth of the trenches is less than the thickness of the first semiconductor layer 110. For example, the depth of the trenches can be from 30 microns to 300 microns, although lesser and greater depths can also be employed. The cross-sectional shape of the trenches can be polygonal, circular, elliptical, or a combination of elements thereof. The lateral dimensions, e.g., the diameter, of the trenches can be from 0.5 micron to 10 microns, although lesser and greater dimensions can also be employed. A dielectric liner (not shown) is formed on sidewalls of the trench, and a conductive material is deposited within the trench to form the array of conductive studs 111. Each conductive stud 111 can include a doped semiconductor material, a metallic material, or a combination thereof. Some of the conductive studs can contact some of the at least one first semiconductor device 120 so that electrically conductive paths are present thereamongst.

The first metal interconnect structure layer is formed on a surface of the first semiconductor layer 110 that is proximal to the at least one first semiconductor device 120. The at least one first semiconductor device 120 is closer to the first metal interconnect structure layer than a surface of the first semiconductor layer 110 that does not contact the first metal interconnect structure layer, i.e., the bottom surface of the first semiconductor layer 110. The first metal interconnect structure layer includes at least one first dielectric material layer 130 and at least one first metal interconnect structure 132 embedded therein. The at least one first metal interconnect structure 132 provides electrical connection among the at least one first semiconductor device 120 through at least one electrically conductive paths within the first metal interconnect structure layer. Further, the at least one first metal interconnect structure 132 provide a plurality of electrically conductive connections up to a plurality of positions on an outermost surface of the at least one first dielectric material layer 130. Some of the at least one first metal interconnect structure 132 can make a direct contact with some of the conductive studs 111.

The at least one first dielectric material layer 130 may include an oxide based dielectric material, which has a dielectric constant k from 3.6 to 3.9, or a low-k dielectric material, which has a dielectric constant k of 3.0 or less, preferably less than 2.8, and more preferably less than 2.5. Non-limiting examples of the oxide based dielectric material include undoped silicate glass (USG), fluorosilicate glass (FSG), borophosphosilicate glass (BPSG), and phosphosilicate glass (PSG). The low-k dielectric material may be a spin-on low-k dielectric material or a CVD low-k dielectric material, i.e., a low-k dielectric material deposited by chemical vapor deposition (CVD). Composition and deposition methods of the CVD low-k dielectric material are well known in the art. For example, the CVD low-k dielectric material may be a SiCOH dielectric containing a matrix of a hydrogenated oxidized silicon carbon material (SiCOH) comprising atoms of Si, C, O and H in a covalently bonded tri-dimensional network. Both the spin-on low-k dielectric material and the CVD low-k dielectric material may be porous, which decreases the dielectric constant of the at least one first dielectric material layer 130. The at least one first dielectric material layer 130 may comprise a stack of at least two of the oxide based conventional dielectric material, the spin-on low-k dielectric material, and the CVD low-k dielectric material.

Each of the at least one first metal interconnect structure 132 includes a metallic material such as Al, W, and Cu. Each of the at least one metallic interconnect structure 132 can include a set of conductive metal lines and conductive metal vias. A conductive metal line provides horizontal electrical connection and a conductive metal via provides vertical electrical connection within the at least one first dielectric material layer 130.

Subsequently, a first array of first solder pads 192 is formed at the plurality of positions on the outermost surface of the at least one first dielectric material layer 130. The plurality of positions includes the exposed portions of at least one first metal interconnect structure 132. The array of the first solder pads 192 is formed directly on an outer surface of the first metal interconnect structure layer (130, 132). The first array of the first solder pads 192 can be formed by depositing and lithographically patterning at least one metallic material layer. The first solder pads 192 can have a square shape, a rectangular shape, a polygonal shape, a circular shape, an elliptical shape, or any combination of elements thereof. The lateral dimension each first solder pad 192 can be about 80 microns to 200 microns. The pitch of the array of the first solder pads can be from 100 microns to 300 microns, although lesser and greater pitches can also be employed.

In one embodiment, an upper portion of the at least one metallic layer includes a material that reflows at a relatively high temperature. For example, the upper portion of the at least one metallic material layer can include a high lead solder including approximately 90% of Pb and 10% of Sn in weight and having a reflow temperature of about 300° C. Upon patterning of the at least one metallic material layer, each of the first solder pad 192 includes a material stack having the same composition as the at least one metallic layer.

In another embodiment, the at least one metallic material layer includes a wettable outer surface, i.e., a surface that can be wetted by a solder material upon reflow. For example, the at least one metallic material can be a Cu layer having a wettable Cu surface, a stack of a Cu and a Ni layer having a wettable Ni surface, a stack of a Cu layer, a Ni layer, and an Au layer having a wettable Au surface, or any other material stack that has a wettable metal surface. Upon patterning of the at least one metallic material layer to form the first solder pads 192, the exposed surface of each of the first solder pads 192 includes a wettable surface, i.e., a surface that a solder material wets upon reflow. The thickness of a wettable material layer in the at least one metallic layer can be about 25 nm to 100 nm, although lesser and greater thicknesses can also be employed.

An array of first solder balls 250 is thereafter placed directly on each first solder pad 192 in the first array of the first solder pads 192. The array of the first solder balls 250 is composed of a first solder material having a relatively low reflow temperature. For example, the array of the first solder balls 250 can be composed of eutectic Sn/Pb solder material having a low reflow temperature in a range from 183° C. to 205° C. Each first solder ball 250 can be substantially spherical, and can have a diameter from 60 microns to 150 microns, although lesser and greater diameters can also be employed.

Figure 2:
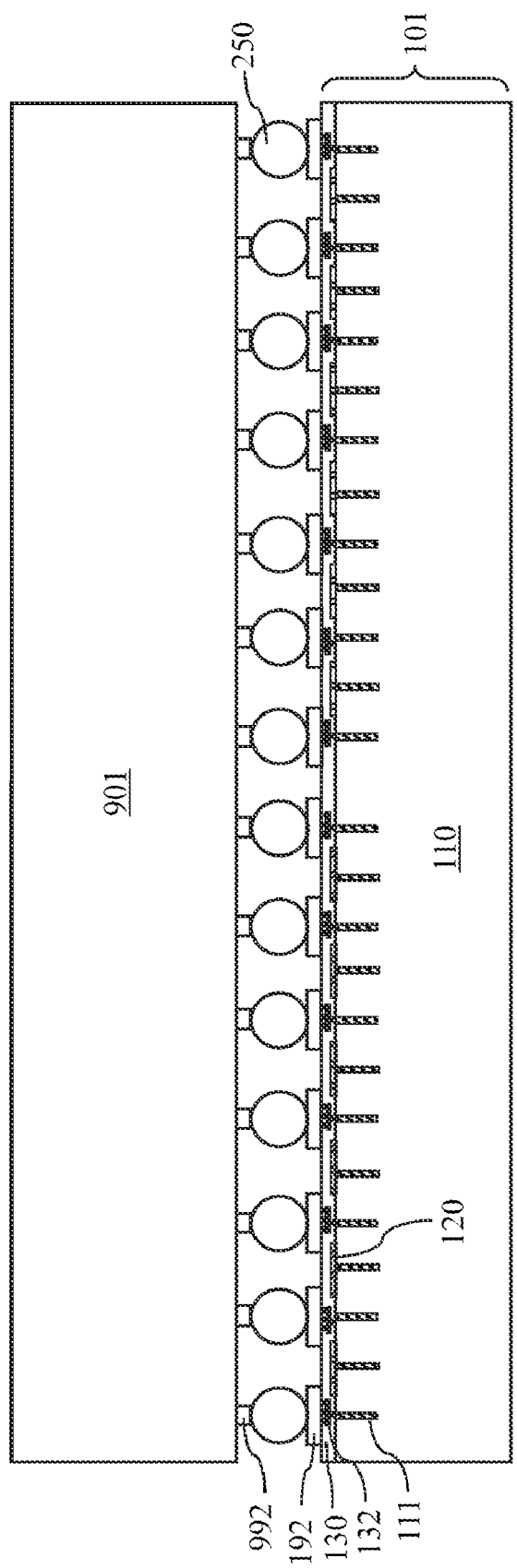
FIG. 2 is vertical cross-sectional view of the first exemplary structure after bonding a temporary substrate to a semiconductor substrate to form a stacked substrate assembly according to the first embodiment of the present invention.

Referring to FIG. 2, a temporary substrate 901 is provided, which can include a semiconductor material, a dielectric material, a conductive material, or any combination thereof. The horizontal extent of the temporary substrate 901 is preferably at least coextensive as the horizontal extent of the semiconductor substrate 101. For example, if the semiconductor substrate 101 is a circular substrate having a diameter of 300 mm, the temporary substrate can be a circular substrate having a diameter of at least 300 mm. The temporary substrate 901 is rigid enough to provide sufficient mechanical strength during handling. Typically, the temporary substrate 901 has a thickness of at least 500 microns, and preferably 800 microns or greater. Preferably, the temporary substrate 901 includes a material that can be cut easily during subsequent dicing step. The temporary substrate 901 is a disposable structure that is not included in a final structure of the first exemplary structure. Thus, the temporary substrate 901 does not typically include any semiconductor device therein. For example, the temporary substrate 901 can be a silicon substrate that does not include any semiconductor device therein.

An array of solder pads 992 is formed on the temporary substrate 992. In one embodiment, the outer surface of the solder pads 992 includes a material that reflows at a relatively low temperature. For example, the outer surface of the solder pads 992 can include a eutectic solder material having a reflow temperature in a range from 183° C. to 205° C.

In another embodiment, the area of each solder pad 992 on the temporary substrate 992 is smaller than the area of a first solder pad 192. For example, the lateral dimension of each solder pad 992 can be from 10 micron to 60 micron, although lesser and greater areas can also be employed. In this case, outer surfaces of the solder pads 992 are wettable surfaces, i.e., surfaces that can be wetted by a solder material. The thickness of a wettable material layer in the at least one metallic layer can be about 25 nm to 100 nm, although lesser and greater thicknesses can also be employed.

The temporary substrate 901 is bonded to the semiconductor substrate 101 to form a stacked substrate assembly through the array of the first solder balls 250. The bonding is performed by reflowing the solder material of the array of the first solder balls 250 at a temperature sufficient high to effect the bonding between the array of the first solder balls 250 and the first array of the first solder pads 192. The bonding between the array of the first solder balls 250 and the array of the solder pads 992 can be effected at a reflow temperature in a range from 183° C. to 205° C.

In one embodiment, a contact area with a solder pad 992 is smaller than a corresponding contact area with a first solder pad 192 for each first solder ball 250 in the array of first solder balls 250. Typically, the array of first solder balls 250 provides a stronger bonding with the semiconductor substrate 101 than with the temporary substrate 90 at a temperature at which the solder material at the interfaces of the first solder balls 250 and the solder pads 992 reflows or any temperature below that temperature.

Figure 3:
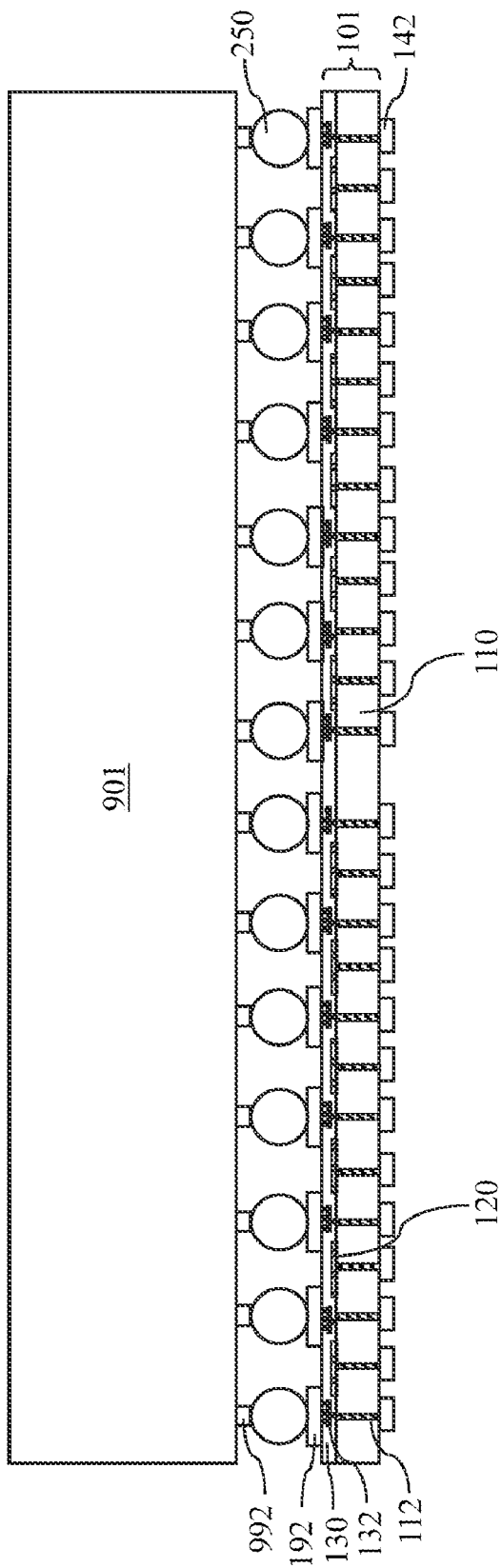
FIG. 3 is a vertical cross-sectional view of the first exemplary structure after thinning of the semiconductor substrate and formation of a second array of second solder pads according to the first embodiment of the present invention.

Referring to FIG. 3, the back side of the semiconductor substrate 101 is removed, for example, by polishing, grinding, etching, or any combination thereof to thin the first semiconductor layer 110. The thinning of the first semiconductor layer 110 is performed while the temporary substrate 901 is bonded to the semiconductor substrate 101 so that the temporary substrate 901 provides mechanical support during a processing step employed for thinning In some cases, the mechanical support provided by the temporary substrate 901 can be critical to achieve an optimal processing result. In one embodiment, the mechanical strength provided by the temporary substrate 901 can enable the thinning of the semiconductor substrate 101 to a thickness without significant yield loss that would not be possible without the presence of the temporary substrate 901. For example, the semiconductor substrate 101 can be thinned to a thickness between 20 microns and 80 microns by polishing by using the temporary substrate 901 as a handle substrate.

Preferably, the thinning of the first semiconductor layer 110 proceeds at least until bottom surfaces of the array of the conductive studs 111 are exposed at the bottom side, i.e., the thinned surface of the first semiconductor layer 110. In this case, each conductive stud 112 in the array of the conductive studs 111 extends at least from the interface between the first semiconductor layer 110 and the first metal interconnect structure layer (130, 132) to the exposed bottom surface of the first semiconductor layer 110. The array of the conductive studs 111 constitute an array of through-substrate vias (TSVs) 112 extending at least from the interface to the exposed surface of the first semiconductor layer 110. The thickness of the first semiconductor layer 110 after thinning depends on the vertical length of the TSVs, and can be from 30 to 300 microns, although lesser and greater thicknesses can also be employed.

A second array of second solder pads 142 is formed directly on the bottom surface of the first semiconductor layer 110. The second array of the second solder pads 142 can be formed by depositing and lithographically patterning at least one metallic material layer on the back side of the first semiconductor layer 110. The second solder pads 142 can have a square shape, a rectangular shape, a polygonal shape, a circular shape, an elliptical shape, or any combination of elements thereof. The lateral dimension each second solder pad 142 can be about 40 microns to 200 microns. The pitch of the second array of the second solder pads 142 can be from 50 microns to 300 microns, although lesser and greater pitches can also be employed. In one embodiment, the pitch of the array of the second solder pads 142 can be a fraction of the pitch of the array of the first solder pads 192. In other words, the pitch of the array of the first solder pads 192 can be a multiple of the pitch of the array of the second solder pads 142 so that there are more second solder pads 142 than the first solder pads 192.

Because the second array of the second solder pads 142 is formed on the bottom side of the first semiconductor layer 110, the second array of the second solder pads 142 does not contact the first metal interconnect structure layer (130, 132). The second array of the second solder pads 142 directly contacts the array of the TSVs 112. The second array of the second solder pads 142 is a metal bump structure that has an exposed surface of Cu, Ni, or Au, or another metal that can bond with a solder material.

Figure 4:
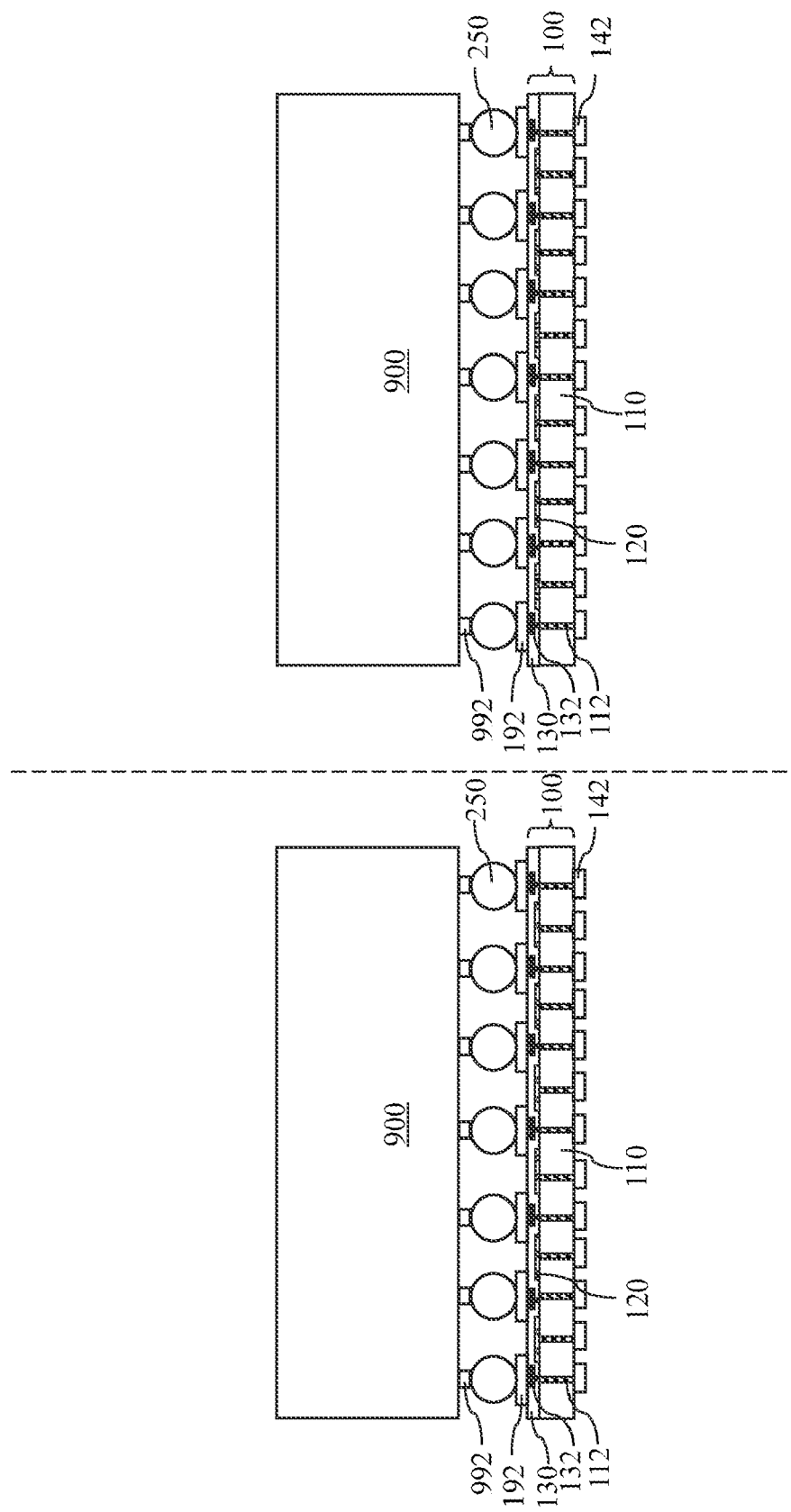
FIG. 4 is a vertical cross-sectional view of the first exemplary structure after dicing of the stacked substrate assembly to form a plurality of stacked temporary structures according to the first embodiment of the present invention.

Referring to FIG. 4, the stacked substrate assembly including the semiconductor substrate 101 and the temporary substrate 901 is diced to form a plurality of stacked temporary structures. Each of the stacked temporary structures includes a first semiconductor chip 100 that is a portion of the semiconductor substrate 101 and a handle portion 900 that is a portion of the temporary substrate 901. Each first semiconductor chip 100 is bonded to a handle portion 900 by an array of the first solder balls 250.

The temporary substrate 901 provides mechanical support to the stacked substrate assembly during the dicing process. The dicing channel typically corresponds to edges of each of the first semiconductor chip 100, which are collectively embedded in the semiconductor substrate 101 prior to the dicing. Because cuts are made into the stacked substrate assembly in a vertical direction during dicing, a first semiconductor chip 100 and a handle portion 900 within the same stacked temporary structure have the same shape and size when viewed in the vertical direction. In other words, the first semiconductor chip 100 and the handle portion 900 within the stacked temporary structure have horizontal cross-sectional shapes that are congruent with each other. Typically, the cross-sectional shape of stacked temporary structure is a rectangle or a square. In one embodiment, the first semiconductor chip 100 is a processor chip.

Figure 5:
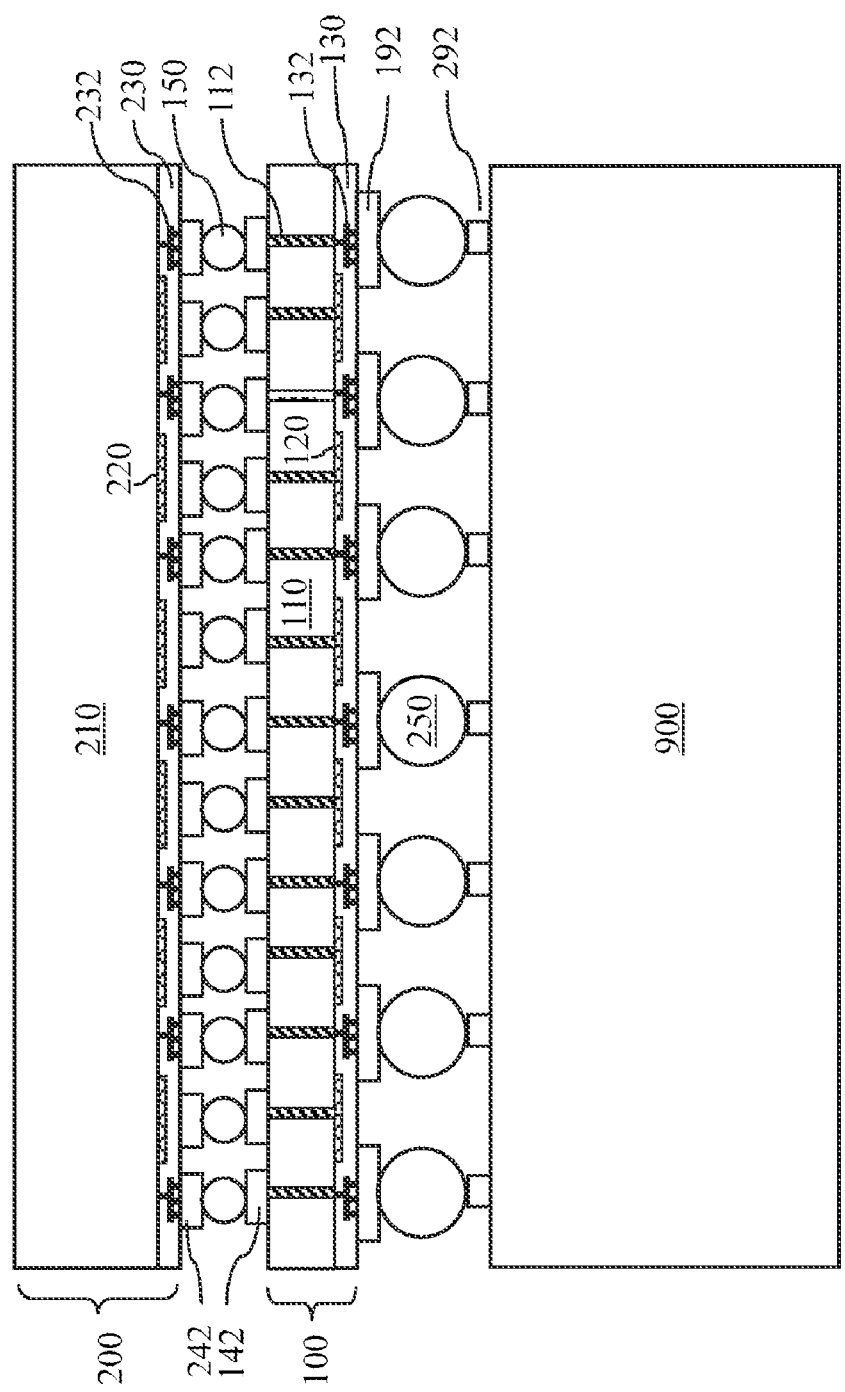
FIG. 5 is a vertical cross-sectional view of the first exemplary structure after bonding a second semiconductor chip to a stacked temporary structure according to the first embodiment of the present invention.

Referring to FIG. 5, a second semiconductor chip 200 is provided, which includes a stack of a second semiconductor layer 210 and a second metal interconnect structure layer. The second semiconductor layer 210 can include any semiconductor material that can be employed for the upper portion of the first semiconductor layer 110 in the semiconductor substrate 101. The second semiconductor layer 110 can be a bulk semiconductor substrate, a semiconductor-on-insulator (SOI) substrate, or a hybrid substrate. For example, the second semiconductor layer 210 can be a single crystal silicon bulk substrate or a single crystal silicon SOI substrate. Preferably, the second semiconductor layer 210 as provided is sufficiently thick to enable mechanical handling without adverse impact on yield. In one embodiment, the second semiconductor layer 210 has a thickness from 500 microns to 1,000 microns, although lesser and greater thicknesses are also contemplated herein.

At least one second semiconductor device 220 is formed on and/or in the second semiconductor layer 210. The at least one second semiconductor device 220 can include a field effect transistor, a bipolar transistor, a memory cell such as a static random access memory (SRAM) cell or an embedded dynamic random access memory (eDRAM) cell, a capacitor, a resistor, an inductor, a varactor, an electrical fuse, an electro-optical semiconductor device, and/or any other type of semiconductor device. In one embodiment, the at least one second semiconductor device 220 form a static random access memory (SRAM) chip, a dynamic random access memory (DRAM) chip, or a non-volatile memory chip. Optionally, another array of conductive studs (not shown) can be provided within the second semiconductor layer 210 to enable bonding of an additional semiconductor chip upon the second semiconductor chip 200.

The second metal interconnect structure layer is formed on a surface of the second semiconductor layer 210 that is proximal to the at least one second semiconductor device 220. The at least one second semiconductor device 220 is closer to the second metal interconnect structure layer than a surface of the second semiconductor layer 210 that does not contact the second metal interconnect structure layer. The second metal interconnect structure layer includes at least one second dielectric material layer 230 and at least one second metal interconnect structure 232 embedded therein. The at least one second metal interconnect structure 232 provides electrical connection among the at least one second semiconductor device 220 through at least one electrically conductive paths within the second metal interconnect structure layer. Further, the at least one second metal interconnect structure 232 provide a plurality of electrically conductive connections to a plurality of positions on an outermost surface of the at least one second dielectric material layer 230.

The at least one second dielectric material layer 230 may include any dielectric material that can be employed for the at least one first dielectric material layer 130 in the semiconductor substrate 101. Each of the at least one second metal interconnect structure 232 includes a metallic material such as Al, W, and Cu. Each of the at least one metallic interconnect structure 232 can include a set of conductive metal lines and conductive metal vias. A conductive metal line provides horizontal electrical connection and a conductive metal via provides vertical electrical connection within the at least one second dielectric material layer 230.

A third array of third solder pads 242 is formed at the plurality of positions on the outermost surface of the at least one second dielectric material layer 230. The plurality of positions includes the exposed portions of at least one second metal interconnect structure 232. The third array of the third solder pads 242 is formed directly on an outer surface of the second metal interconnect structure layer (230, 232). The third array of the third solder pads 242 can be formed by depositing and lithographically patterning at least one metallic material layer. The lateral dimension each third solder pad 242 can be about 40 microns to 200 microns. The pitch of the array of the third solder pads 242 can be from 50 microns to 300 microns, although lesser and greater pitches can also be employed. The pitch of the array of the third solder pads 142 matches the pitch of the second array of the second solder pads 142.

In one embodiment, the exposed surfaces of the third array of the third solder pads 242 does not include any material that reflows. In another embodiment, the exposed surface of the third array of the third solder pads 242 includes a material that reflows at a medium range reflow temperature, i.e., at a reflow temperature from 225° C. to 260° C.

The second semiconductor chip 200 is bonded to a stacked temporary structure through an array of second solder balls 150. In order to effect the bonding, the second solder balls 150 are placed between the second solder pads 142 and the third solder pads 242. The array of the second solder balls 150 is composed of a second solder material having a higher reflow temperature than the first solder material. For example, the array of the second solder balls 150 can be composed of high lead content Sn/Pb solder material having a reflow temperature from 225° C. to 260° C. Each second solder ball 150 can be substantially spherical, and can have a diameter from 30 microns to 100 microns, although lesser and greater diameters can also be employed. The array of the second solder balls 150 is bonded to the second array of second solder pads 142 located on the first semiconductor chip 100 in the stacked temporary structure and the third array of the third solder pads 142 located on the second semiconductor chip 200.

Figure 6:
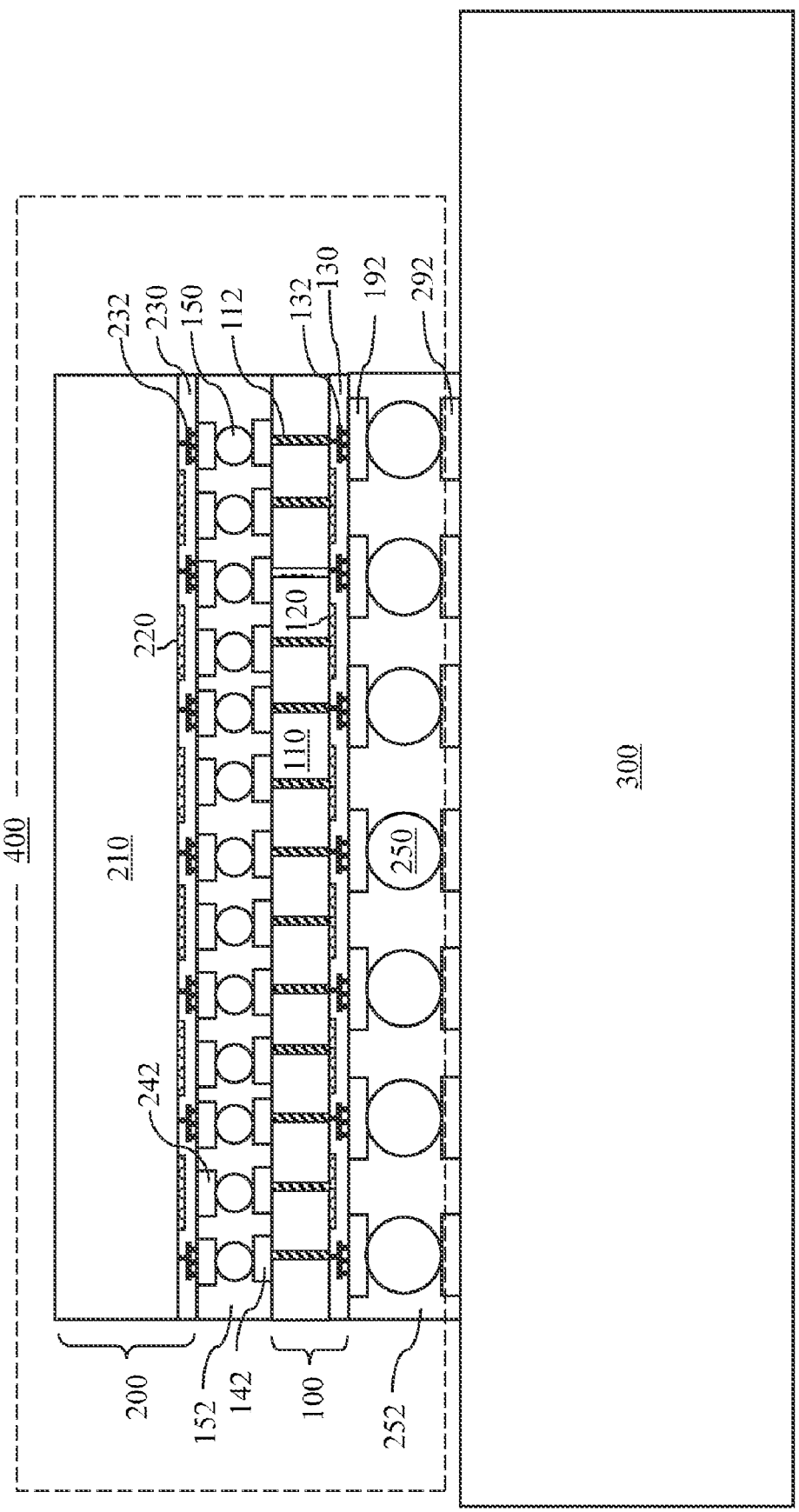
FIG. 6 is a vertical cross-sectional view of the first exemplary structure after detaching a handle portion of the stacked temporary structure to form a stacked semiconductor chip structure, and after attaching the stacked semiconductor chip structure to a packaging substrate according to the first embodiment of the present invention.

Referring to FIG. 6, the handle portion 900 is detached from the stacked temporary structure to form a stacked semiconductor chip structure 400. The stacked semiconductor chip structure includes, from top to bottom, the second semiconductor chip 200, the third array of the third solder pads 242, the array of the second solder balls 150, the second array of the second solder pads 142, the first semiconductor chip 100, a portion of the first array of first solder pads 192, and a portion of the array of first solder balls 250.

The handle portion 900 can be detached, for example, by partially reflowing the array of the first solder balls 250 and applying a sheer force that is sufficient to physically disconnect the array of solder pads 992 from the array of the first solder balls 250, while keeping the array of the first solder balls 250 attached to the first array of the first solder pads 192. The partial reflowing of the array of the first solder balls 250 can be effected, for example, by raising the temperature of the array of the first solder balls 250 up to, or slightly below, the reflow temperature of the first solder material in the first solder balls 250. For example, the partial reflow temperature can be in a range from 183° C. to 205° C. if eutectic Sn/Pb is employed for the first solder material.

The present invention can be implemented employing any scheme that provides differential bonding strengths between the semiconductor substrate 110 and the handle portion 900 such that the semiconductor substrate 110 is bonded more strongly to the first array of first solder balls 250 than the handle portion 900 is. For example, at a temperature at which the solder material at the interfaces of the first solder balls 250 and the solder pads 992 reflows, the bonding strength between the array of the first solder balls 250 and the first array of the first solder pads 192 is greater than the bonding strength between the array of the first solder balls 250 and the array of the solder pads 992. The difference in the bonding strength can be effected by different wettable materials having different reflow temperature on the surfaces of the first array of the first solder pads 192 and the surface of the array of solder pads 992, by different sizes of the first solder pads 192 and the solder pads 992, or by a combination of the two factors.

A packaging substrate 300 is provided, which can be a ceramic packaging substrate or a laminate packaging substrate. An array of package-side bonding pads 292 are formed on one side of the packaging substrate 300. The stacked semiconductor chip structure 400 is then bonded to the packaging substrate 300 through the array of the first solder balls 250 located on the first semiconductor chip 100, which is a subset of the array of the first solder balls 250 located on the semiconductor substrate 101 in FIG. 1. The bonding of the stacked semiconductor chip structure 400 to the packaging substrate 300 can be effected by raising temperature of the first solder balls 250 to the reflowing temperature of the first solder material.

Subsequently, a first dielectric underfill layer 152 is formed to fill the space between the first semiconductor chip 100 and the second semiconductor chip 200. The second dielectric underfill layer 252 is formed to fill the space between the first semiconductor chip 100 and the packaging substrate 300. The first dielectric underfill layer 152 and the second dielectric underfill layer 252 seal the first semiconductor chip 100 and the second semiconductor chip 200 to provide protection from ingress of moisture and/or contaminants. The first exemplary structure including the first semiconductor chip 100, the second semiconductor chip 200, and the packaging substrate 300 is a multi-chip assembly of semiconductor chips.

Figure 7:
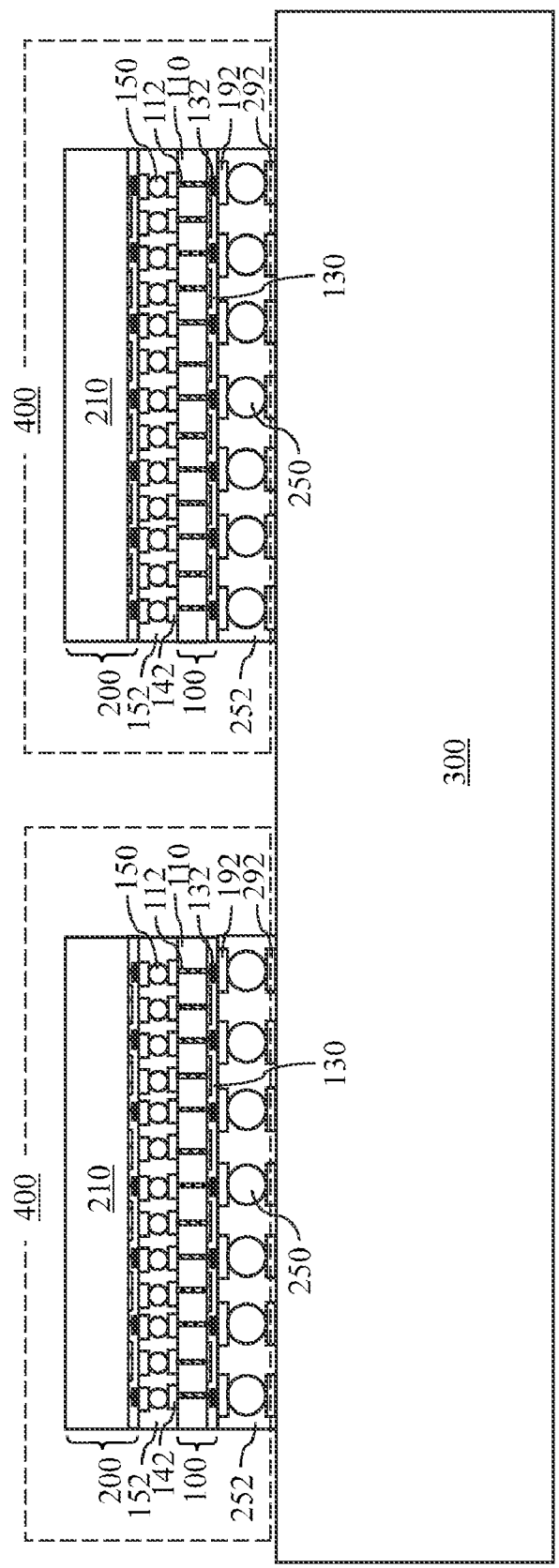
FIG. 7 is a vertical cross-sectional view of a second exemplary structure after attaching a plurality of stacked semiconductor chip structures to a packaging substrate according to a second embodiment of the present invention.

Referring to FIG. 7, a second exemplary structure according to a second embodiment of the present invention is formed by attaching a plurality of stacked semiconductor chips 400 to a packaging substrate 300. Each stacked semiconductor chip structure 400 includes, from top to bottom, a second semiconductor chip 200, a third array of third solder pads 242, an array of second solder balls 150, a second array of second solder pads 142, a first semiconductor chip 100, a portion of an array of first solder pads 192, and a portion of an array of first solder balls 250.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a multi-chip assembly of semiconductor chips comprising:

forming a stacked substrate assembly by bonding a semiconductor substrate to a temporary substrate through an array of first solder balls that bonds to an array of first solder pads on said semiconductor substrate;

dicing said stacked substrate assembly to form a plurality of stacked temporary structures, each of said plurality of stacked temporary structures comprising a first semiconductor chip that is a portion of said semiconductor substrate and a handle portion that is a portion of said temporary substrate;

bonding a second semiconductor chip to a stacked temporary structure among said plurality of stacked temporary structures, wherein an array of second solder balls is bonded to an array of second solder pads located on a first semiconductor chip in said stacked temporary structure and an array of third solder pads located on said second semiconductor chip;

detaching a handle portion from said stacked temporary structure to form a stacked semiconductor chip structure; and forming a multi-chip assembly of semiconductor chips by bonding at least one stacked semiconductor chip structure including said stacked semiconductor chip structure to a packaging substrate.

2. The method of claim 1, wherein said stacked semiconductor chip structure comprises, from top to bottom, said second semiconductor chip, said array of third solder pads, said array of second solder balls, said array of second solder pads, a first semiconductor chip, a portion of said array of first solder pads, and a portion of said array of first solder balls.

3. The method of claim 1, wherein said stacked semiconductor chip structure is bonded to said packaging substrate through a portion of said array of said first solder balls.

4. The method of claim 3, further comprising forming an array of package-side bonding pads on a surface of said packaging substrate, wherein said stacked semiconductor chip structure is bonded to said packaging substrate through a portion of said array of first solder balls that is bonded to said array of package-side bonding pads and to a portion of said array of first solder pads on a first semiconductor chip in said stacked semiconductor chip structure.

5. The method of claim 3, further comprising bonding another stacked semiconductor chip structure to said packaging substrate, wherein said stacked semiconductor chip structure comprises, from top to bottom, said second semiconductor chip, said array of third solder pads, said array of second solder balls, said array of second solder pads, a first semiconductor chip, a portion of said array of first solder pads, and a portion of said array of first solder balls, and wherein said other stacked semiconductor chip structure comprises, from top to bottom, another second semiconductor chip, another array of third solder pads, another array of second solder balls, another array of second solder pads, another first semiconductor chip, another portion of said array of first solder pads, and another portion of said array of first solder balls.

6. The method of claim 1, wherein said semiconductor substrate includes a stack of a metal interconnect structure layer and a semiconductor layer, wherein said array of first solder pads is formed directly on an outer surface of said metal interconnect structure layer.

7. The method of claim 1, further comprising thinning said semiconductor substrate while said temporary substrate is bonded to said semiconductor substrate and before said dicing.

8. The method of claim 7, wherein said array of second solder pads is formed on a surface of a thinned semiconductor layer after said thinning and prior to said dicing.

9. The method of claim 1, further comprising forming an array of conductive studs in a semiconductor layer in said semiconductor substrate prior to said bonding of said semiconductor substrate to said temporary substrate, wherein said array of said conductive studs extends at least from an interface between said semiconductor layer and a metal interconnect structure layer to a depth into said semiconductor layer.

10. The method of claim 9, further comprising thinning said semiconductor layer while said temporary substrate is bonded to said semiconductor substrate and before said dicing, wherein said array of said conductive studs constitute an array of through-substrate vias (TSVs) extending at least from said interface to an exposed surface of said semiconductor layer after said thinning.

11. The method of claim 10, wherein said array of said second solder pads is formed directly on said exposed surface of said semiconductor layer after said thinning.

12. The method of claim 1, wherein said semiconductor substrate includes a stack of a first semiconductor layer and a first metal interconnect structure layer, said second semiconductor chip includes a stack of a second semiconductor layer and a second metal interconnect layer, said array of said first solder pads is formed directly on said first metal interconnect structure layer, and said array of said third solder pads is formed directly on said second metal interconnect structure layer.

13. The method of claim 12, wherein said array of said second solder pads is formed directly on a surface of said first semiconductor layer and does not contact said first metal interconnect structure layer.

14. The method of claim 12, wherein said first semiconductor layer comprises at least one first semiconductor device and said second semiconductor layer comprises at least one second semiconductor device.

15. The method of claim 14, wherein said temporary substrate does not include any semiconductor device.

16. The method of claim 1, wherein a first semiconductor chip and a handle portion within said stacked temporary structure have horizontal cross-sectional shapes that are congruent with each other.

17. The method of claim 1, wherein said array of said first solder balls is composed of a first solder material, and said array of said second solder balls is composed of a second solder material, wherein said first solder material has a lower reflow temperature than said second solder material.

18. The method of claim 1, further comprising forming an array of solder pads on said temporary substrate, wherein a contact area with a solder pad in said array of solder pads is smaller than a contact area with a first solder pad in said array of said first solder pads for each first solder ball in said array of first solder balls.

19. The method of claim 1, further comprising:
forming a first dielectric underfill layer between said first semiconductor chip and said second semiconductor chip; and
forming a second dielectric underfill layer between said first semiconductor chip and said packaging substrate.

20. The method of claim 1, wherein said packaging substrate is a ceramic packaging substrate or a laminate packaging substrate, said first semiconductor chip is a processor chip, and said second semiconductor chip is a static random access memory (SRAM) chip, a dynamic random access memory (DRAM) chip, or a non-volatile memory chip.

* * * * *